US006884641B2

(12) United States Patent
Bruley et al.

(10) Patent No.: US 6,884,641 B2
(45) Date of Patent: Apr. 26, 2005

(54) SITE-SPECIFIC METHODOLOGY FOR LOCALIZATION AND ANALYZING JUNCTION DEFECTS IN MOSFET DEVICES

(75) Inventors: John Bruley, Poughkeepsie, NY (US); Terence Kane, Wappingers Falls, NY (US); Michael P. Tenney, Poughkeepsie, NY (US); Yun Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,258

(22) Filed: Sep. 18, 2003

(65) Prior Publication Data

US 2005/0064610 A1 Mar. 24, 2005

(51) Int. Cl.$^7$ .......................... H01L 31/26; H01L 21/66
(52) U.S. Cl. ..................... 438/14; 438/197; 438/902
(58) Field of Search ............................ 438/14, 98, 197, 438/233, 455, 902

(56) References Cited

U.S. PATENT DOCUMENTS 5,427,965 A  *  6/1995  Tehrani et al. .............. 438/169

OTHER PUBLICATIONS

*Two Dimensional Mapping of the Eleectrostatic Potential in Transistors by Electron Holography*, W.D. Rau, P. Schwander, F.H. Baumann, W. Hoppner, and A. Ourmazd, The American Physical Society, vol. 82, No. 12, Mar. 1999, pp. 2614–2617.

*Electron Holography of Semiconductor Structures: Principles and Recent Results*, Michael A. Gribelyuk, Martha R. McCartney, Microelectronic Failure Analysis Desk Reference 2002 Supplement Copyright © 2002. ASM International®, pp. 69–74.

*Focused Ion Beam Milling for Site Specific Scanning and Transmission Electron Microscopy Specimen Preparation*, L.A. Giannuzzi, J.L. Drown, S.R. Brown, R.B. Irwin, and F.A. Stevie, pp. 347–348.

*FIB Lift–Out for Defect Analysis*, Lucille A. Giannuzzi, Brian W. Kempshall, Shawn D. Anderson, Brenda I. Prenitzer, and Thomas M. Moore, Microelectronic Failure Analysis Desk Reference 2002 Supplement. Copyright © 2002. ASM Internatiional®, pp. 29–35.

*Mapping of Electrostatic Potential in Deep Submicron CMOS Devices by Electron Holography*, M.A. Gribelyuk, M.R. McCartney, Jing Li, C.S. Murthy, P. Ronsheim, B. Doris, J.S. McMurray, S. Hegde and David J. Smith, The American Physical Society, vol. 89, No. 2, Jul. 2002, pp. 1–4.

*Visulisation of Electrically Active Areas Using Electron Holography*, U. Muehle, A. Lenk, M. Lehmann and H. Lichte, Proceedings from the 28$^{th}$ International Symposium for Testing and Failure Analysis, Nov. 3–7, 2002, pp. 39–45.

* cited by examiner

Primary Examiner—Phuc T. Dang
(74) Attorney, Agent, or Firm—DeLio & Peterson, LLC; Kelly M. Reynolds; Lisa U. Jacklitsch

(57) ABSTRACT

This invention relates to a method for electrically localizing site-specific defective sub 130 nm node MOSFET devices with shallow (less than 80 nm deep) source/drain junctions utilizing bulk silicon, or Silicon on Insulator (SOI), or strained silicon (SE), followed by optimized sample preparation steps that permits imaging, preferably high resolution electron holographic imaging, in an electron microscope to detect blocked implants, asymmetric doping, or channel length variations affecting MOSFET device performance. Detection of such defects in such shallow junctions enables further refinements in process simulation models and permits optimization of MOSFET device designs.

20 Claims, 9 Drawing Sheets

SITE-SPECIFIC METHODOLOGY FOR LOCALIZATION AND ANALYZING JUNCTION DEFECTS IN MOSFET DEVICES

BACKGROUND OF THE INVENTION

1. Field of the Invention

The present invention relates to an apparatus and processes for electrically localizing site-specific defects in sub-micron MOSFET devices.

2. Description of Related Art

Transmission electron microscopes (TEMs) are commonly used in the process of fabricating integrated circuits. TEMs are used to microscopically examine portions of a semiconductor die to determine the results of new or conventional processes. The examination may be to confirm the results of an experimental process, to determine the nature of a particular failure or defect in a semiconductor device, or even to find impurities within the semiconductor device. Of course, because of the nature of integrated circuits, the examination must often be performed on samples cut from the die in question.

Examination of a wafer for impurities is crucial in the semiconductor fabrication process as certain impurities, in certain concentrations and within specific materials, typically cause semiconductor device failure. In so doing, the wafer is removed from the production line, or the fully processed die in a completely finished semiconductor package, is brought to an analytical tool to inspect for any impurities, such as, inspection via a TEM tool.

Conventional imaging techniques include the use of electron holography in TEM tools. This frequently involves using focused ion beam microscopy (FIB). Focused ion beams (FIB) are commonly relied on for the spatially localized preparation, repair and editing of integrated circuits. With the use of FIB, ion beams are typically generated by an FIB tool, which utilizes a liquid metal ion source, typically gallium (Ga+), from which highly energetic beams (E>30 keV) are formed and then focused onto the sample surface by electrostatic lenses. However, exposure to these highly energetic ion beams often causes IC damage, gallium contamination, and physical sputtering of the sample surface.

As the demand for higher performance integrated circuits dictates smaller critical dimension feature sizes with shallower implant junction depths and ever thinner MOSFET gate films, the use of FIB processing will also increase. Currently, a number of techniques exist in the art for electron holography and sample preparation using FIB microscopy for transmission electron microscopy (TEM). However, the art is deficient in TEM holography techniques to verify site-specific defects in sub-micron devices, i.e., 130 nm and smaller, due to limitations in electrical characterization isolation, sample surface preparation methods and requirements for uniformity thickness.

Current techniques are not reliable or sufficient for electrically isolating or imaging site-specific defects in these sub-micron MOSFET junctions. In fabricating smaller samples, it would be advantageous to have a processing method that enables the electrical isolation of site-specific defects in MOSFET devices for sub 130 nm sized devices with gate oxide/gate nitridized films less than 2 nm in thickness or with ALD (atomic layer deposited) high dielectric constant gate films. Therefore, a need continues to exist in the art for improved methods of electrically cally localizing site-specific defects in sub-micron MOSFET devices.

SUMMARY OF INVENTION

Bearing in mind the problems and deficiencies of the prior art, it is therefore an object of the present invention to provide improved methods for electrically localizing site-specific defects in sub-micron MOSFET devices.

It is another object of the present invention to provide a method that allows the imaging and detection of defects in shallow (less than 80 nm) junctions with junction lengths less than 100 nm.

Other objects and advantages of the invention will in part be obvious and will in part be apparent from the specification.

The above and other objects and advantages, which will be apparent to one of skill in the art, are achieved in the present invention, which, is directed to in a first aspect, a method for electrically isolating and analyzing site-specific defects in a MOSFET, preferably a sub-micron MOSFET device having source/drain junctions less than about 80 nm deep with junction lengths less than about 100 nm. The MOSFET may include a substrate layer comprising bulk silicon, silicon on insulator, strained silicon junctions and combinations thereof.

The method includes electrically localizing at least one specific site of at least one defective feature of a MOSFET device. Once electrically localized, a first cap layer is then deposited over the exposed metal layer of the MOSFET device to cover the defective feature. An opening is then formed in the first cap layer over the specific site of the defective feature, and then such opening is provided with an electrical connection. Once the electrical connection is made, a second cap layer is deposited over a portion of the first cap layer. This second cap layer covers the defective feature and a portion of the electrical connection. The first and second cap layers are removed at least within the specific site of the defective feature to obtain a site-specific junction for imaging, preferably holographic imaging. A conductive coating is then deposited over this site-specific junction and then the defective feature within the site-specific junction is analyzed via imaging.

The step of providing the MOSFET device with at least one electrical connection further includes depositing a conductive liner on sidewalls of the opening, depositing a conductive pad over the first cap layer and then providing a plurality of conductive wiring connections between the conductive liner and the conductive pad. The second cap layer is then deposited over the first cap layer, wherein the second cap layer fills empty portions of the plurality of openings and covers both the defective feature and portions of the conductive wiring connections while leaving the conductive pad region exposed. Prior to removing; the first and second cap layers, preferably via FIB gallium ion milling, the method may further include the step of sequentially polishing a first surface and a second surface of the MOSFET device to within 20 microns of the site-specific junction for holographic imaging.

In accordance with the invention, subsequent to the step of FIB gallium ion milling the first and second cap layers, each of a first surface and a second surface of the MOSFET device may be incrementally milled to remove implanted gallium ions during the FIB gallium ion milling, as well as remove any damaged layers of the MOSFET device. The conductive coating may comprise a conductive carbon coating deposited to a thickness ranging from about 75 angstroms to about 150 angstroms.

In the invention, the defective feature within the site-specific junction is analyzed via high resolution electron holographic imaging in a transmission electron microscope scope for the detection of the at least one defective feature of the MOSFET device. This defective feature may include, but is not limited to, blocked implants, asymmetric doping, channel length variations and combinations thereof. The first cap layer preferably comprises a high-k cap layer while the second cap layer preferably comprises a metal cap layer. This high-k cap layer may comprise tetraorthosilicate, diethyl silane, titanium isoproproxide, RF deposited oxide, RF deposited nitride and combinations thereof deposited to a thickness ranging from about 600 angstroms to about 1500 angstroms. The high-k (k>10) cap layer is an essential feature in the present method of electrically isolating site-specific MOSFET device to substantially eliminate damage, including, gallium implantation, amorphization silicon damage surface layers associated with focused ion beam microscopy.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1A:
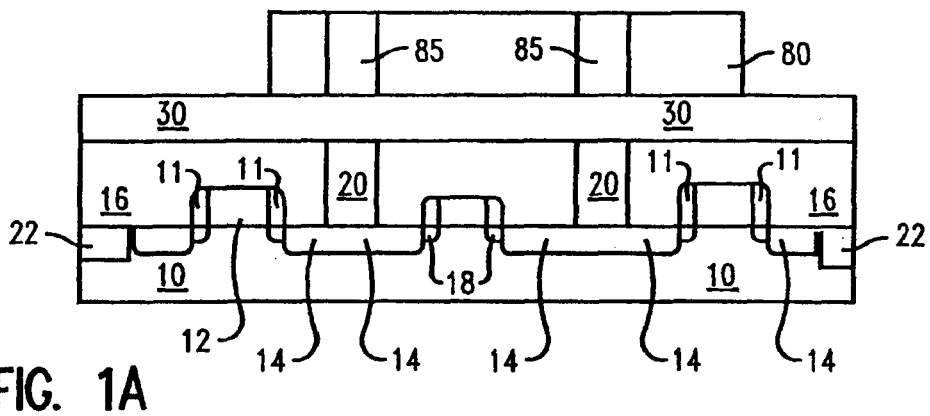
FIG. 1A is a cross sectional view of a first embodiment of a MOSFET structure having the protective high k dielectric cap layer of the invention with holes traversing therethrough and contacting an underlying metallization layer to permit electrical contact with the underlying MOSFET structure.

In describing the preferred embodiment of the present invention, reference will be made herein to FIGS. 1A–8 of the drawings in which like numerals refer to like features of the invention. Features of the invention are not necessarily shown to scale in the drawings.

The present invention is directed to a method for electrically localizing site-specific defective sub-micron 130 nm node MOSFET devices with shallow (less than 80 nm deep) source/drain junctions, i.e., with junction lengths less than 100 nm, utilizing bulk silicon, Silicon on Insulator (SOI) or strained silicon (SE). Once the defect is localized, the sample preparation steps are optimized in accordance with the invention to permit high-resolution, e.g., about 1 nm to about 2 nm, off-axis electron holographic imaging in transmission electron microscope (TEM) to detect blocked implants, asymmetric doping, and/or channel length variations that affect the overall MOSFET device performance.

Detection of these defects in shallow junctions enables further refinement in process simulation models and permits optimization of MOSFET device designs. These MOSFET designs may include CMOS inverter circuits, CMOS SRAM circuits and the like. In accordance with the invention, the actual effective junction can be imaged and compared with designed junction layout/junction depth, effective implant depth. Advantageously, the invention overcomes resolution limitations of scanning capacitance microscopy in other analytical techniques including, but not limited to, scanning Kelvin probing microscopy, scanning probe microscopy, scanning tunneling microscopy techniques as well as limitations in beam size imaging associated with SIMS, AUGER, ESCA, SEM ECX and sensitivity limitations of conventional TEM microprobe techniques.

The invention will be better understood in accordance with the below description of the preferred embodiment for site-specific localization and site-specific analysis/identification of defects in sub-micron junctions. An ultra large-scale integrated circuit (ULSI) is provided, which, may comprise a MOSFET device having at least one CMOS PFET device and one CMOS NFET device, such as, an inverter circuit or as a multiple combination of inverter circuits, such as, an SRAM circuit.

Figure 1B:
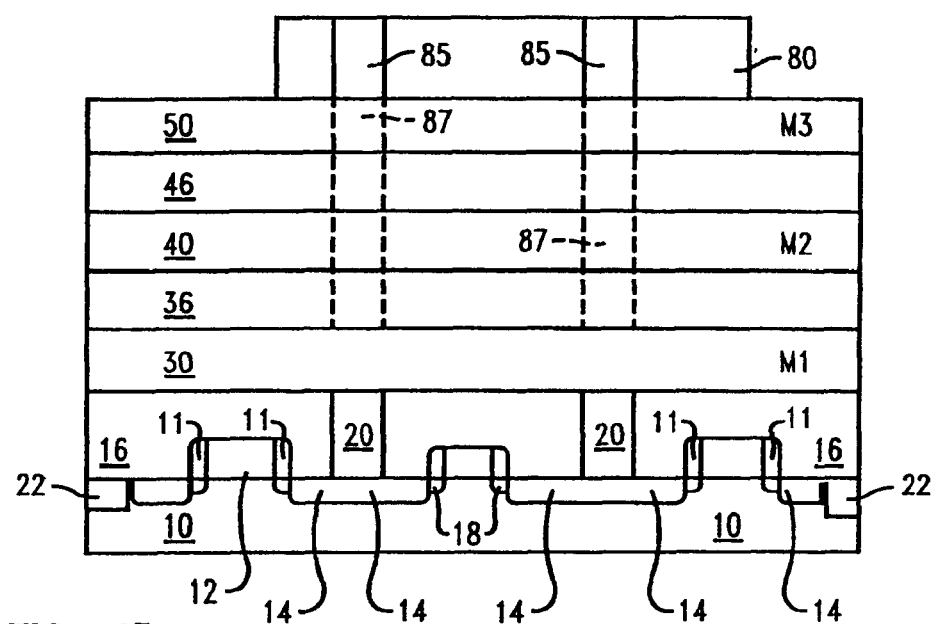
FIG. 1B is a cross sectional view of an alternate embodiment of a MOSFET structure on bulk silicon for processing in accordance with the invention.
Figure 1C:
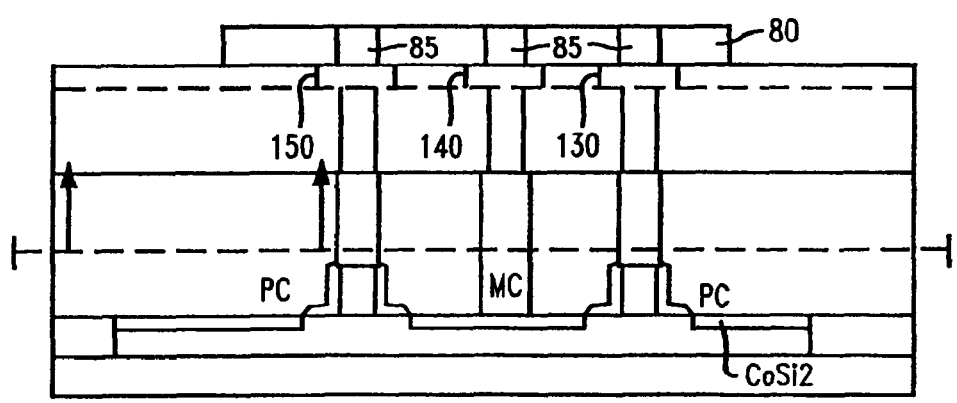
FIG. 1C is a cross sectional view of still another embodiment ment of a MOSFET structure on SOI for processing in accordance with the invention.

Referring to the drawings, FIGS. 1A, 1B and 1C show alternate MOSFET structures that may be processed in accordance with the invention. As shown in FIGS. 1A and 1B, the starting substrate may comprise bulk silicon, or alternatively as shown in FIG. 1C, the starting substrate may comprise silicon on insulator (SOI).

As shown in FIG. 1A, a MOSFET is shown built from bulk silicon 10 whereby the MOSFET includes sidewall spacers 11, polysilicon gates 12, source/drain regions 14, lightly doped regions 18, electrical contacts 20 and shallow trench isolations 22. The electrical contacts are isolated from each other by an insulator layer 16, such as BPSG, and at least one metallization layer 30 residing over the insulator layer 16. Alternatively, as shown in FIG. 1B, MOSFET may include a plurality of sequentially deposited metal layers or a plurality of metallization-insulator-metallization, e.g., insulator layer 16, metal layer 30, insulator layer 36, metal layer 40, insulator layer 46 and metal layer 50. Still further, the metal layers may comprise a plurality of metal layers 130, 140, 150 separated from each other by insulator as shown in FIG. 1C. These metallization layers may comprise any known metallization material including, but not limited to, tungsten, tungsten carbonyl, platinum, nickel, alloys thereof, combinations thereof, and the like.

In yet other embodiments of the invention, MOSFET may be any of a variety of known MOSFET structures used in the art built from any known substrate material. For example, the substrate of the MOSFET may comprise SOI, as shown in FIG. 1C, a combination of strained silicon junctions with bulk silicon or with SOI substrates, and the like. Due to the sub-micron feature sizes of ULSI MOSFET devices processed in accordance with the invention, metallization layers are preferably deposited by techniques including, for example, FIB, CVD of controlled thickness and width/length. An essential feature of the present invention is that the MOSFET device be fabricated prior to electrical isolation thereof.

Once the MOSFET is fabricated to completion, any sub-micron defects on the MOSFET device are then electrically localized, particularly, site-specific defects in sub-micron (130 nm node) MOSFET devices with shallow (less than 80 nm deep) source/drain junctions, with junction lengths less than 100 nm, are electrically localized. The site-specific defective junction region is electrically localized to either the drain or source side of the MOSFET. Preferably, this step is accomplished using precision probe tips contacting the FIB CVD deposited metal pads, which in turn, are connected by the FIB metal wires deposited in accordance with the invention. As discussed further below, these deposited metal wires extend from contact holes over the defective feature, which, are in a protective high-k cap layer 80, to the metallization levels connected to the MOSFET device of interest. External automatic testing equipment or industry standard parametric analyzers provide stimulus to MOSFET device regions of interest, i.e., those defective regions for analysis by TEM, to assist in electrical isolation of drain or source side of MOSFET.

The electrical localization of any defective junctions preferably uses any known forward and reverse threshold voltage technique on PFETS and NFETS where Id ~/=K/2 (Vgs-Vt)$^2$ and where Vt is a function of Vgs (voltage of the gate source). On a PFET MOSFET device, sub-threshold voltage measurements (Vt) are performed when the nominal applied voltage to the PFET device=Vdd=Vground equals 1 volt or less. For 130 nm node technology, this Vdd voltage level is defined to maintain a logic one state or is typically 1 volt or less. Under these voltage bias conditions, the NFET MOSFET device(s) in series with this PFET device (i.e. Inverter circuit or SRAM circuit or the like) are kept off permitting PFET MOSFET device characterization. On an NFET MOSFET device, the sub-threshold voltage measurements are similarly performed at a Vdd voltage level defined to maintain a logic one state, which, is typically zero volt or less for 130 nm node technology. Here, Vdd=Vground equals zero volt. Under these bias conditions, the PFET MOSFET device(s) in series with this NFET device (i.e. Inverter circuit or SRAM circuit or the like) are kept off permitting NFET MOSFET device characterization.

Once the specific site(s) of any sub-micron defects are electrically localized to either the drain or source side of the MOSFET, a top layer, or alternatively a plurality of top layers of the MOSFET device are removed to expose an underlying metal layer over at least one electrical body contact 20 of the MOSFET device in need of repair, editing or the like. Depending on the layout of the ULSI MOSFET, the removal of the top layers of the MOSFET device may involve stopping at a metallization level 30 that is at least one level, as shown in FIG. 1A, above the level of the polysilicon gate, therein isolating it from plasma charges, accelerating ion beams, as well as gallium ions, xenon difluoride gas chemistries, bromine gas chemistries (associated with FIB) in these charge sensitive MOSFET devices and the like. Alternatively, as shown in FIG. 1B, the top layers of the MOSFET may be removed, therein stopping at a metal layer 50 that is several metal layers above the level of the polysilicon gate.

In the preferred embodiment, it is crucial that these layers of metallization be removed by a technique that substantially avoids damaging or scratching any underlying dielectric layers of the MOSFET structure, particularly low-k dielectrics used in fabricating the sub-micron MOSFET structure, as well as minimizes or substantially eliminates any charge buildup that may potentially damage the MOSFET gate films, particularly those with thickness less than 2 nm.

Preferably, the metallization layers are removed by a collimated noble gas using a low energy ion beam at low incident angles on a sample affixed to a rotating, cooled stage for optimum planarization of the surface area. In the preferred embodiment, the metallization layers are removed in an atmosphere of argon using an ion beam having energy of less than about 600 electron volts and at an angle between about 12 and 20 degrees. These techniques are particularly useful for the removal of metallization layers over low-k BEOL (back end of line) interlevel dielectric films with low modulus and thin gate film structures susceptible to charging damage from the FIB, plasma processing, and whereby such layers remain substantially undamaged.

Referring again to FIG. 1A, after the top layers of the MOSFET device are removed to expose metallization layer 30, an essential feature of the invention is that a first protective cap layer 80, preferably a protective high-k cap layer 80, is directly deposited over portions of the exposed metallization layer 30. In particular, the first cap layer 80 may be blanket deposited to cover the entire wafer surface, or alternatively, to at least cover the regions of the exposed defective electrical body contact(s) regions as shown in FIGS. 1A–C and 2. The protective high-k (k>10) dielectric layer 80 may be deposited at least one metal layer above the MOSFET device (FIGS. 1A and 1C), or alternatively several metallization levels above the MOSFET device (FIG. 1B). The protective high-k dielectric layer 80 is preferably deposited by techniques including, for example, RF sputter, CVD, dual beam FIB deposition and the like, to a thickness ranging from about 600 angstroms to about 1500 angstroms. Preferably, this first dielectric protective high-k cap layer 80 comprises a material including, but not limited to, tetraorthosilicate (TEOS), DES (diethyl silane), titanium isoproproxide or RF deposited oxide, RF deposited nitride, combinations thereof and the like.

The protective cap layer 80 protects the underlying thin gate film 12 and any low-k dielectric films in the MOSFET device during further processing steps. Particularly, it significantly prevents any gallium ion implantation into the underlying dielectric films during any subsequent FIB processing, especially low-k films, as well as substantially avoids any charge buildup from accelerating FIB voltage levels of 30 kV and higher that pose risks of rupturing thin gate films of MOSFET devices. The protective cap 80 also avoids amorphization of underlying silicon layers.

Figure 2A:
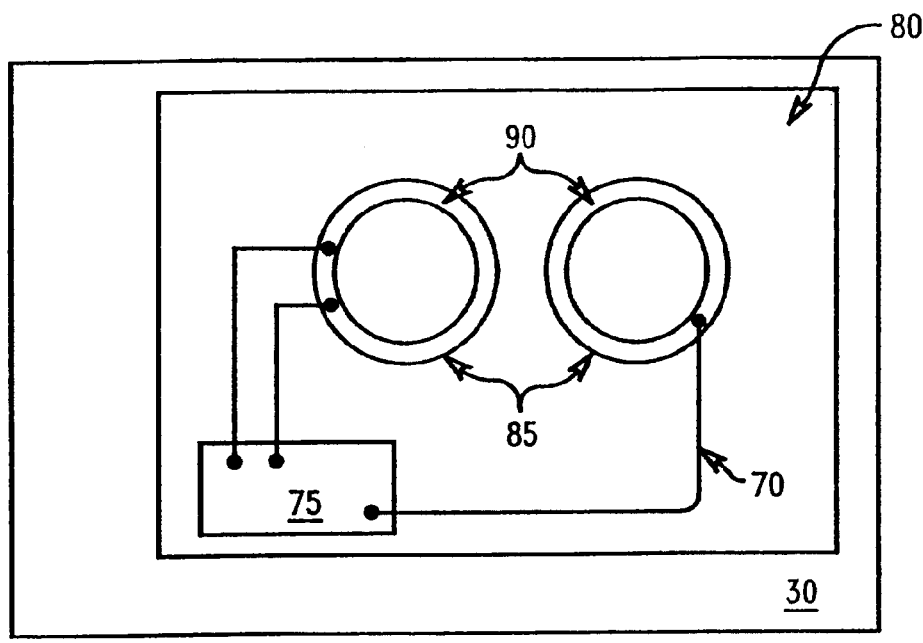
FIG. 2A is a schematic top plan view of FIGS. 1A–C showing conductive wiring connections between a thin conductive film within openings in the protective high-k cap layer and a distant probing pad on such cap layer.

Once this first protective cap layer 80 is deposited directly onto the exposed metallization layer, at least over the electrically localized defective features 20, a plurality of holes 85 are drilled through the protective cap layer stopping at the metallization layer in contact with the underlying MOSFET device regions in need of repair. These FIB drilled holes are about 0.2 um in diameter or less. The holes 85 are drilled via FIB so as to traverse through metallization layer(s) and optionally any dielectric layer(s), including low k dielectrics (k<2.2), residing there-between two metallization layers, as shown in FIG. 2, stopping at a top surface of the metallization layer in contact with the MOSFET device (s) of interest. That is, as shown by dashed line 87 in FIG. 1B, the holes 85 are drilled through metallization layers 50, 40 and dielectric layers 46, 36 stopping at a top surface of metal layer 30 which is in contact with the MOSFET device. Referring to FIGS. 2A–3C, after the plurality of holes 85 are drilled through the protective cap layer 80 and any underlying metal and/or insulator layers (FIG. 3B), a thin conductive wiring or connection film 90 is then deposited within each of the plurality of openings 85, preferably by FIB CVD, so as to at least conformally coat the sidewalls of each of these openings. This conductive wiring film 90 may comprise a material including, tungsten, tungsten carbonyl, platinum, nickel, alloys thereof, combinations thereof and the like deposited to a thickness that at least leaves portions of the holes 85 empty, i.e., the film 90 does not fill openings 85. Preferably, the conductive wiring or connection film 90 is deposited to a thickness ranging from about 50 angstroms to about 300 angstroms, more preferably less than about 150 angstroms.

In accordance with the invention, this step of coating the inside diameter of the FIB drilled holes 85 with the thin conductive film 90, prior to electrical characterization, provides the required conduction or connection path for electrical probing, while substantially avoiding any charge buildup and gallium ion implantation into any underlying low-k porous dielectric films. The thin conductive wiring film 90 also minimizes dwell time and exposure of the region of interest to high acceleration gallium ion beam (30 to 50 kV) energies.

Figure 2B:
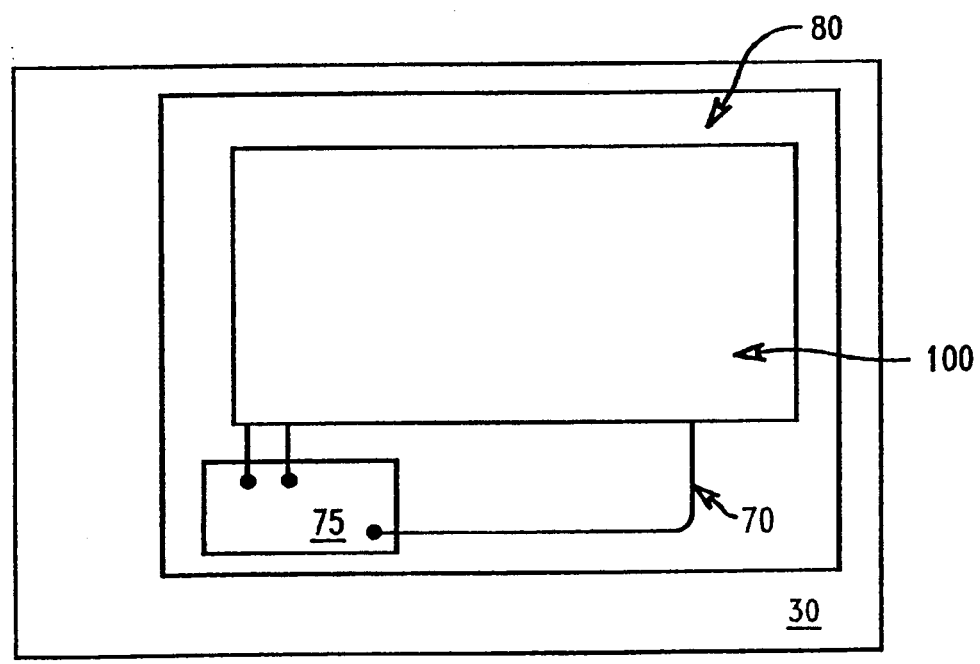
FIG. 2B is a schematic top plan view of FIG. 2A showing the openings in the protective high-k cap layer covered with a metal cap layer.
Figure 3A:
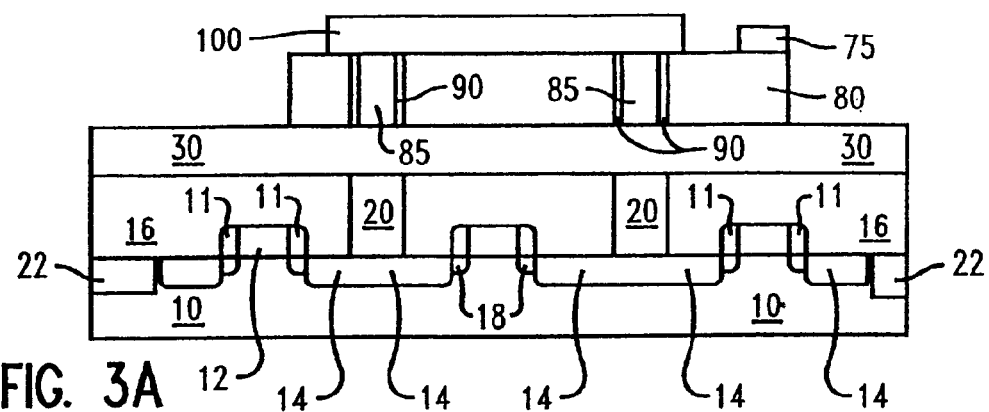
FIG. 3A is a cross sectional view showing the metal cap layer of FIG. 2B deposited on the MOSFET structure of FIG. 1A.
Figure 3B:
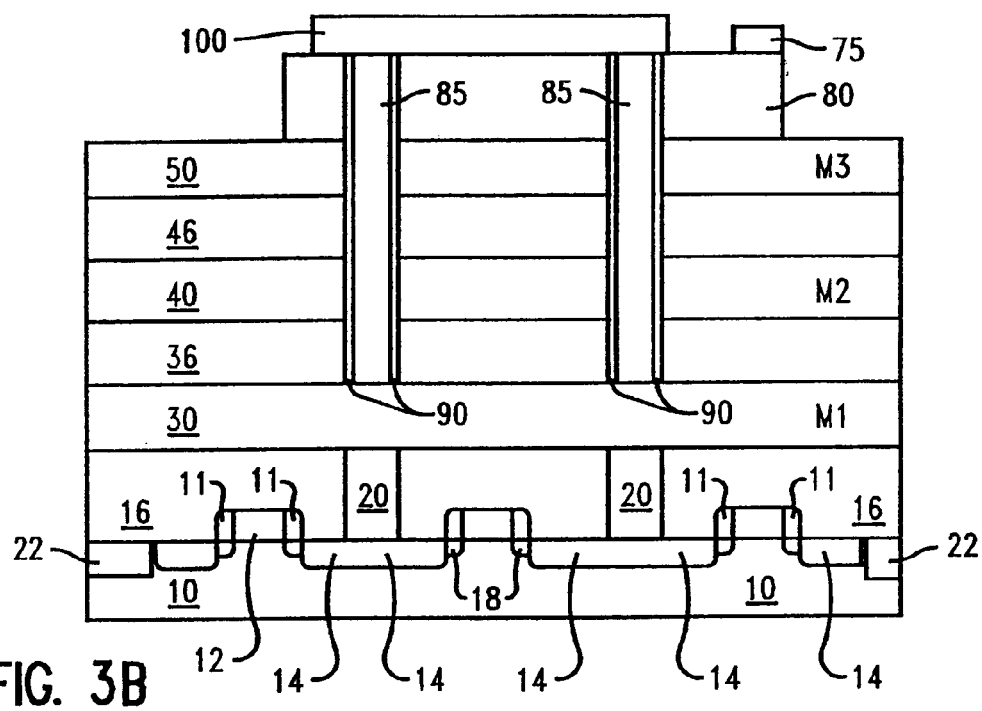
FIG. 3B is a cross sectional view showing the metal cap layer of FIG. 2B deposited on the MOSFET structure of FIG. 1B.
Figure 3C:
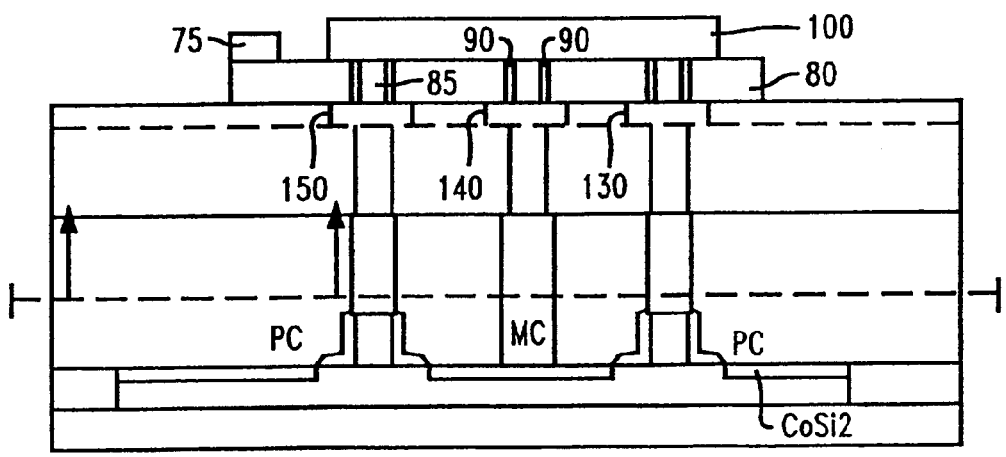
FIG. 3C is a cross sectional view showing the metal cap layer of FIG. 2B deposited on the MOSFET structure of FIG. 1C.

Referring to the top plan views of FIGS. 2A and 2B, it should be understood that these drawings are for illustration purposes only, and are drawn for ease of understanding the electrical probing step in accordance with the invention.

In the electrical probing step of the invention, a plurality of conductive wiring connections 70 are then formed, preferably by FIB CVD, in a direction that is away from the sensitive underlying region of the MOSFET device to be analyzed by TEM, as shown in the top plan representative views of FIGS. 2A and 2B. These conductive wiring connections 70 connect the thin conductive film 90 within openings 85 to a distant, larger conductive pad region 75 that resides on the protective cap layer 80 to permit electrical probing. In the present invention, by depositing the thin conductive film 90 on sidewalls of openings 85, and connecting such conductive film 90 to large conductive probe pad region(s) 75 via the conductive connectors 70, the risks of charge buildup, gallium ion implantation and silicon amorphous damage are significantly reduced.

The conductive probe pad regions 75 are deposited directly on the protective high-k dielectric cap layer 80 at a distant site away from the defective region of the MOSFET to be analyzed by TEM. Preferably, the conductive probe pad regions 75 are deposited at a distance ranging from about 10 microns to about 20 microns away from the region of the MOSFET device to be further processed in accordance with the invention for TEM analysis. The conductive probe pad regions may comprise tungsten, tungsten carbonyl, platinum, nickel or other metallic materials CVD deposited in the FIB, and have dimensions ranging from about 2 microns×3 microns to about 5 microns×10 microns, preferably about 3 microns×5 microns. Advantageously, as these conductive probe pad regions 75 are located at significant distance away from the defective region of the MOSFET any charging damage by the FIB process are significantly reduced or eliminated therein permitting the site-specific electrical localization of the defective features of the MOSFET to be analyzed by TEM.

Once the steps of electrically localizing specific sites of defective features of the MOSFET device are complete, the MOSFET sample is prepared for electron holographic imaging in the TEM tool. In so doing, as shown in FIGS. 2B–3C, a second cap layer 100 is directly deposited over the first protective high-k dielectric cap layer 80. The second cap layer 100 is preferably conformally deposited only over the region of the MOSFET device to be analyzed by TEM and fills the remaining empty portions of openings 85 coated with the conductive film 90. That is, this second cap layer 100 is site-specific as it does not cover the conductive probe pad regions 75 residing on the first protective high-k dielectric cap layer 80 at a distance away from the region of the MOSFET to be analyzed. The second cap layer 100 may comprise tungsten, tungsten carbonyl, platinum, or other metallic material deposited by FIB CVD, preferably to a thickness of about 0.5 microns and area dimensions of about 3 microns×5 microns.

Figure 4A:
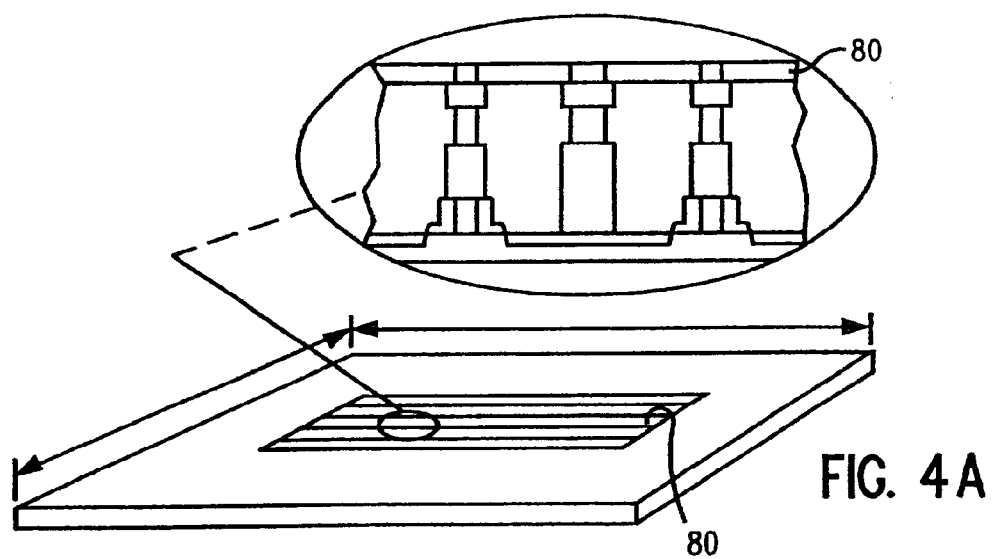
FIG. 4A is a perspective and cross sectional view showing the defective region of interest, i.e., the electrically isolated specific site of the MOSFET to be analyzed via TEM.
Figure 4B:
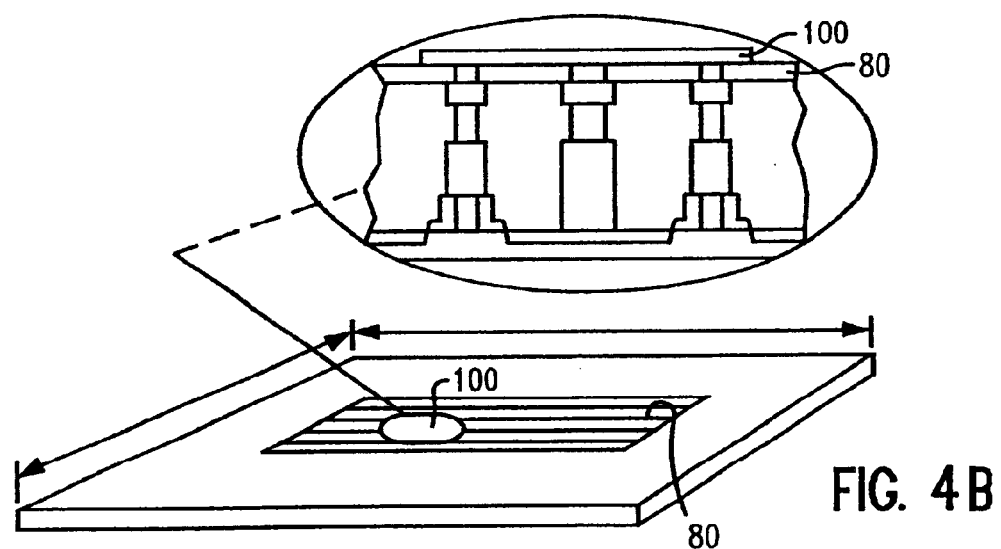
FIG. 4B is a perspective and cross sectional view showing the MOSFET of FIG. 4A having the second metal cap layer over the openings within the protective high-k cap layer.
Figure 4C:
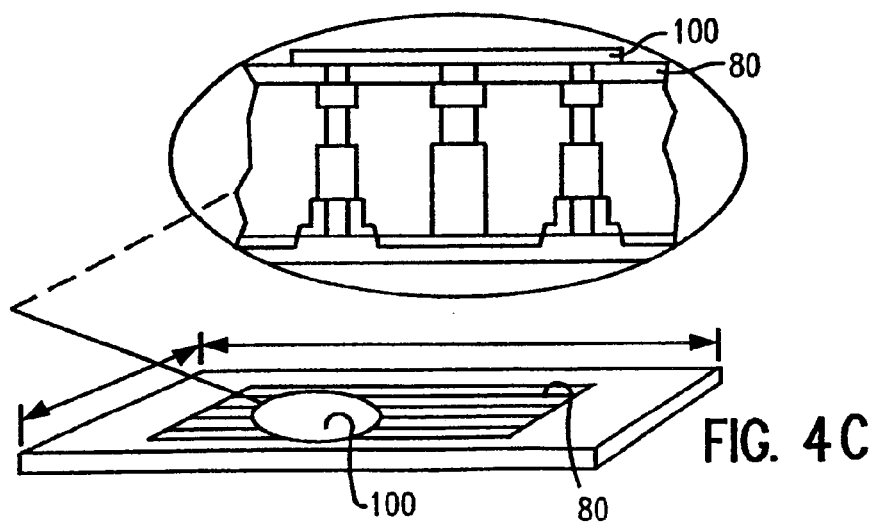
FIG. 4C is a perspective and cross sectional view showing the MOSFET of FIG. 4B after initial TEM sample close polish surrounding the region of interest.

Thus in the present invention, once specific site of the defect on the MOSFET device has been electrically isolated as shown in FIG. 4A, the second metal capping layer 100 is directly deposited over such electrically isolated specific site, as shown in FIG. 4B. Subsequently, both sides of the MOSFET device to be analyzed are then polished to within 20 microns on both sides of the MOSFET junction region under analysis, as shown in FIG. 4C. The sides of the MOSFET may be polished using a conventional standard tripod manual polish fixture.

Figure 5A:
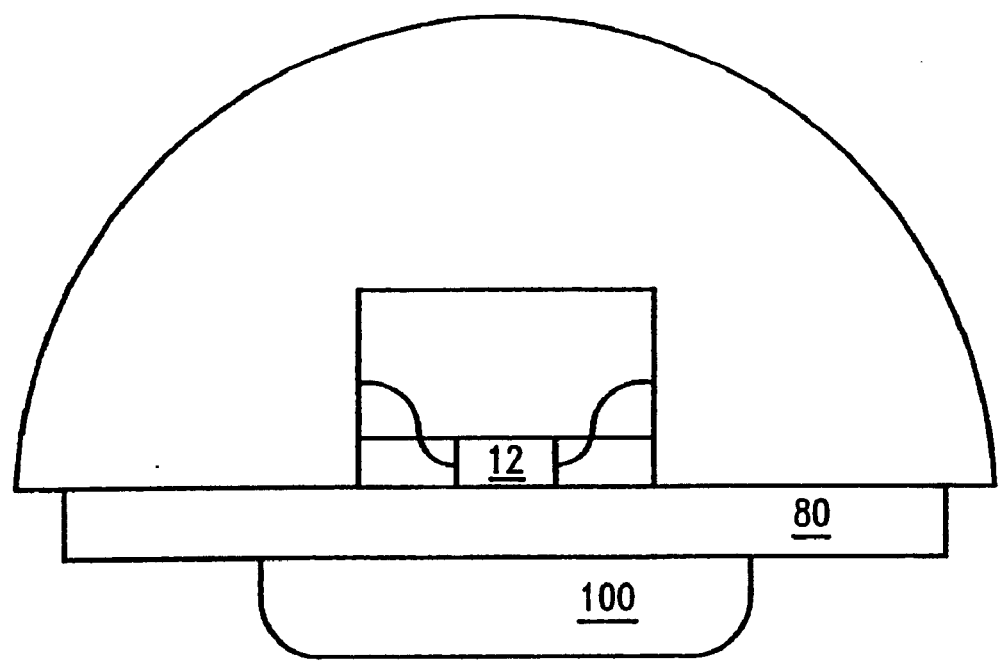
FIGS. 5A and 5B are perspective and cross sectional views of the MOSFET of FIG. 4C before and after, respectively, the step of removing the metal cap layer and the high-k dielectric cap layer.
Figure 5A:
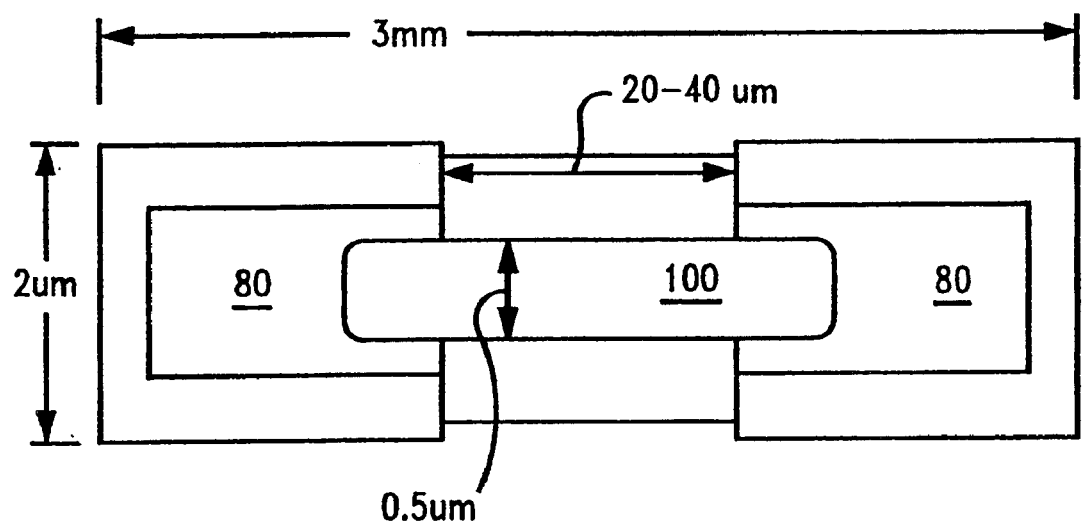
Figure 5B:
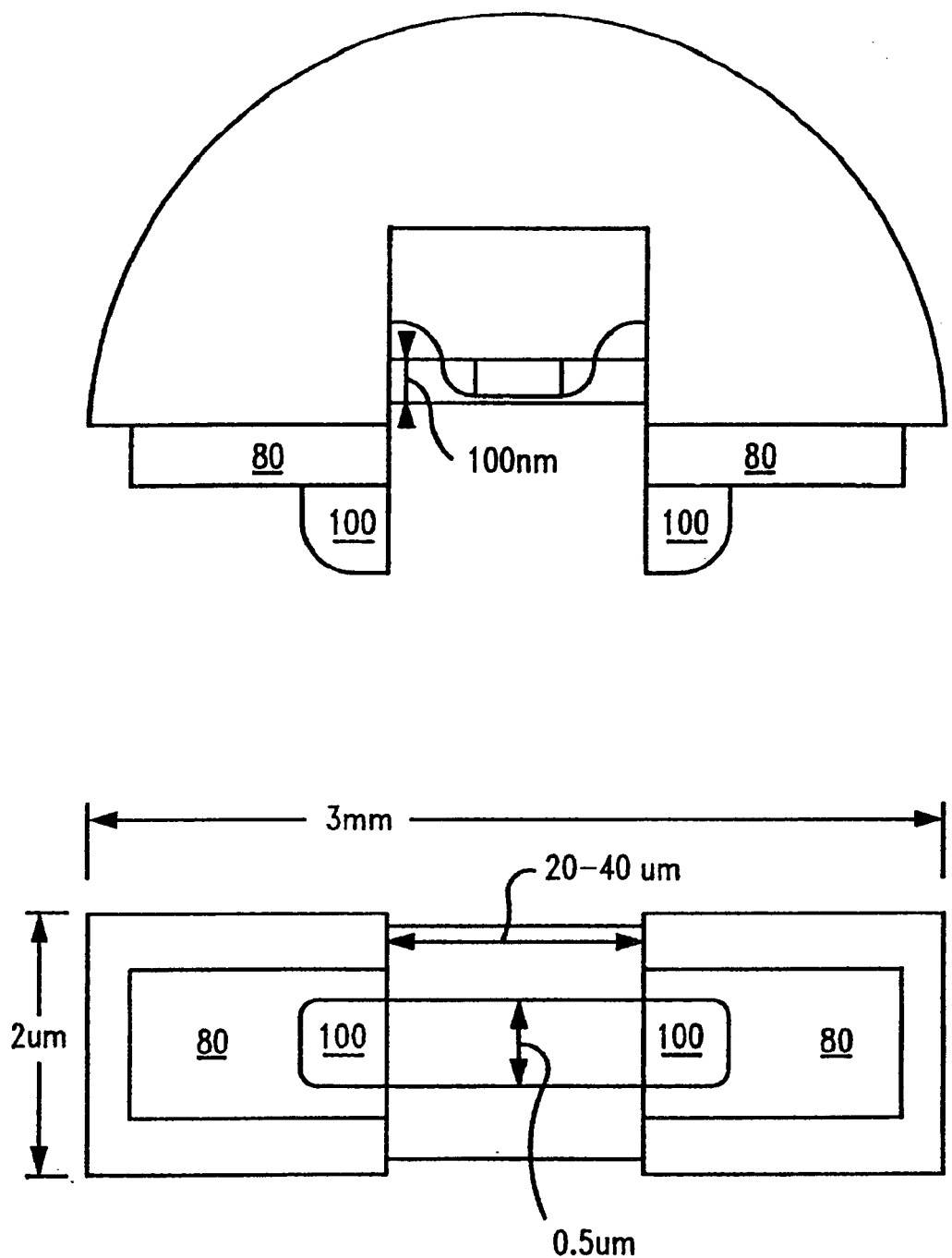

Referring to FIGS. 5A and 5B, after the MOSFET device is polished to within 20 microns of the region to be analyzed, this region of the MOSFET is then milled, preferably via FIB precision milling. In so doing, the mechanically polished MOSFET device is attached to a conventional TEM grid whereby at least both the high k cap layer 80 and the metal cap layer 100 are trimmed, i.e., removed, over the region of interest by FIB to ensure that an edge of the trimmed MOSFET device is about 100 nm from the junction region of interest (FIG. 5B).

Figure 8:
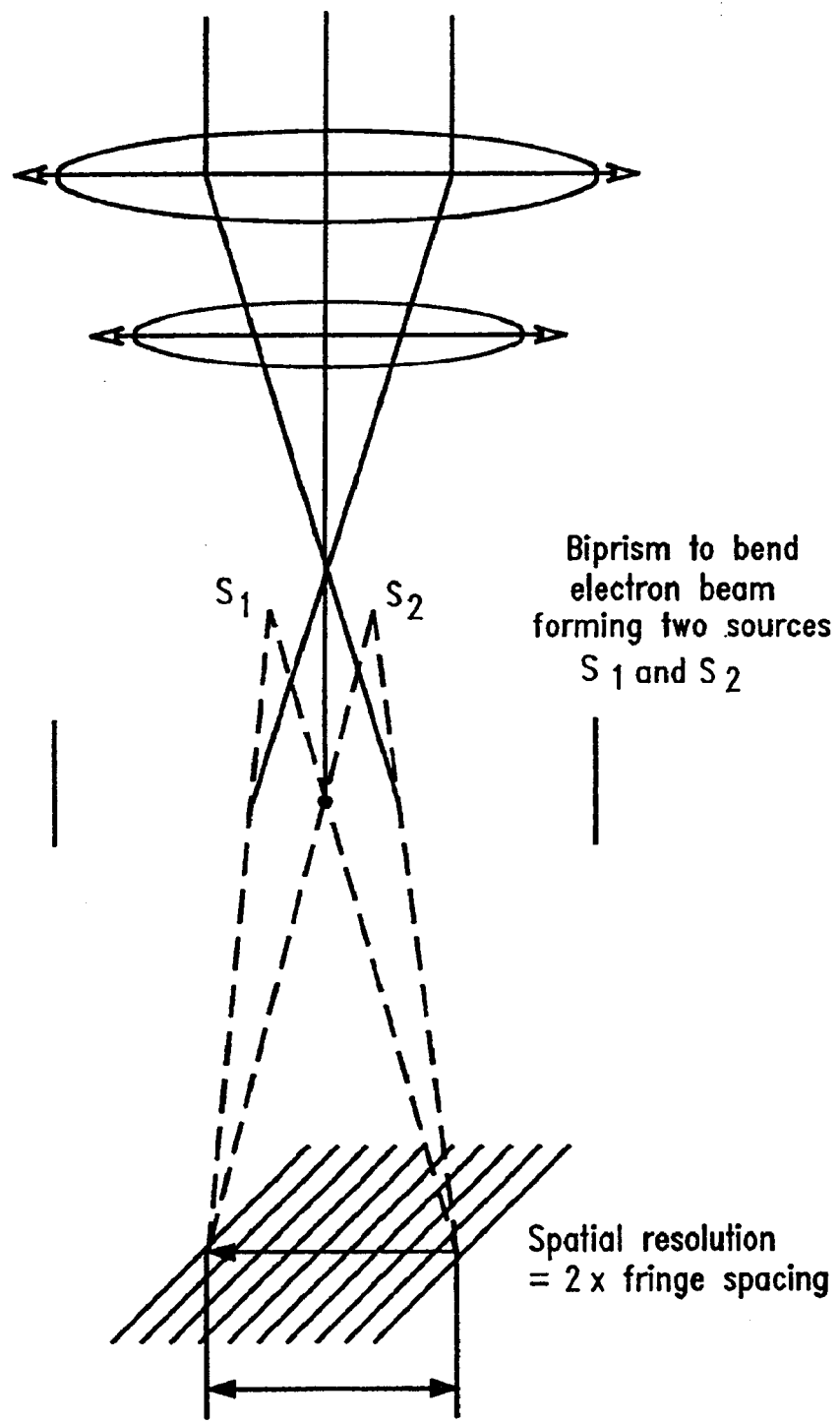
FIG. 8 is a schematic illustration of an off axis electron holographic imaging incident beam for use in accordance with the invention for permitting high-resolution in order to detect blocked implants, asymmetric doping, and/or channel length variations on the MOSFET of FIGS. 6 and 7 that will affect the overall performance of such MOSFET device.

In accordance with the invention, it is essential that the FIB trimmed edge be within about 100 nm from the junction region of interest in order for this region of the MOSFET to subsequently be holographically imaged due to the imaging plane limit of the off axis electron holography tool. This limited width of the interference fringe field of view of this off axis electron holography incident beam is depicted in FIG. 8.

Referring to the top plan and cross sectional views of FIG. 5B, showing a MOSFET processed in accordance with the invention, the FIB trimming of both of the protective cap layer and the metal cap layer 100 advantageously achieves the site-specific junction for subsequent holographic imaging. However, during such FIB milling processes, the surfaces of the MOSFET that have been exposed to the energetic (30 kEV to 50 kEV) FIB gallium ion beam, exhibit gallium contamination and amorphized silicon damage layers, both of which prevent subsequent electron holographic imaging. Further, the thickness of the trimmed MOSFET device is also not within the sample planarity and uniformity, i.e., about 250 nm to about 350 nm thick, requirements for electron holography.

Figure 6:
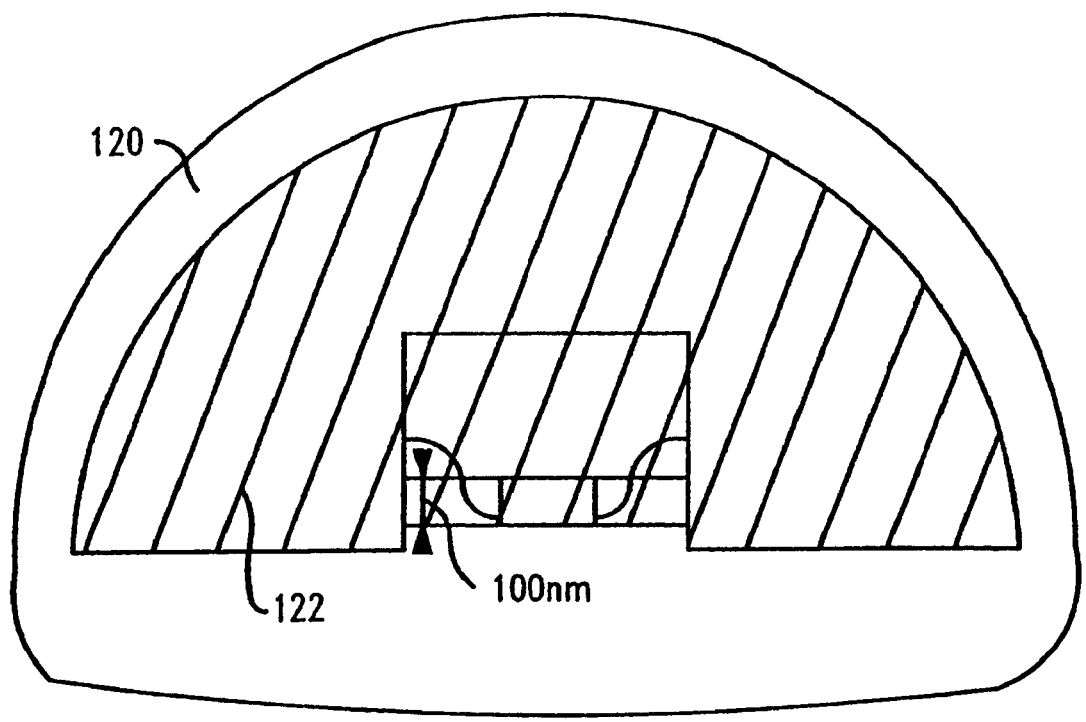
FIG. 6 is a top plan view and a cross sectional view of subjecting the structure of FIG. 5 to a noble gas ion beam incremental milling process.
Figure 6:
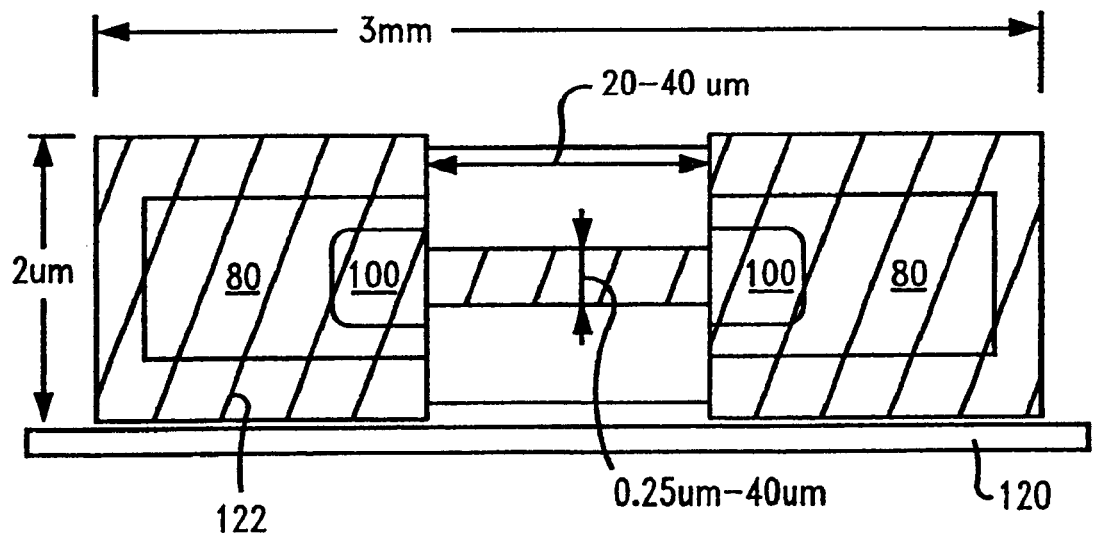
Figure 7:
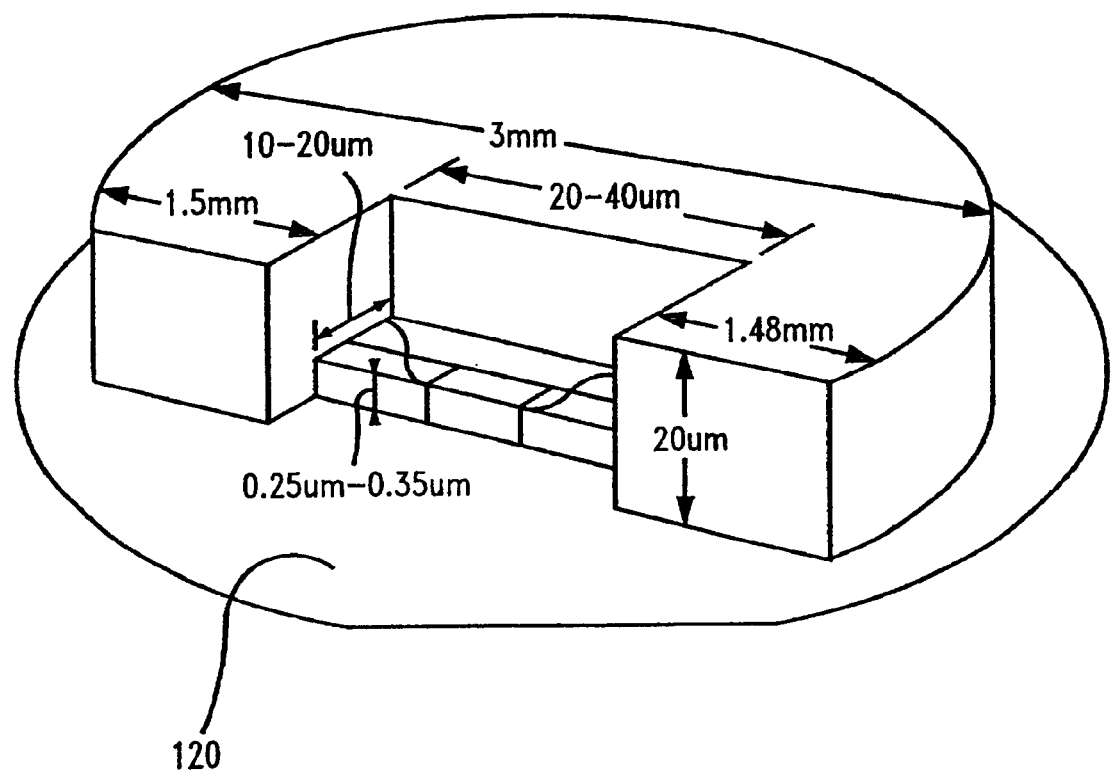
FIG. 7 is a perspective view of the resultant structure of FIG. 6.

To address the gallium ion contamination and silicon amorphization surface damage caused by the above FIB processing, both surfaces of the MOSFET device are then sequentially subjected to a noble gas ion beam incremental milling process as shown in FIGS. 6 and 7. The noble gas may comprise any noble gas, or combinations thereof. In the preferred embodiment, the noble gas comprises argon or helium. In the present invention, this step of noble gas ion beam incremental milling advantageously removes both any gallium ions implanted during the previous FIB trimming process, as well as any amorphous and/or damaged layers of the MOSFET device.

Preferably, the MOSFET device is affixed to a carbon planchet fixture, in order to prevent sputter re-deposition of metallic materials on faces of MOSFET cross sectioned devices, and then a first surface of such MOSFET device is subjected to a noble gas ion beam milling process at a high incident angle. The high incident angle optimizes planarization uniformity and controllable ion beam removal rates. In addition, the incident noble gas collimated ion beam sputters and redeposits carbon from the carbon planchet to the surfaces of the junction implant regions under analysis. This carbon conductive film satisfies another requirement for successful electron holography imaging as the exposed surfaces must be conductive.

An essential feature of the invention is that the MOSFET device is affixed with high temperature silicone or equivalent grease (for heat transfer characteristics) to the carbon planchet fixture 120, which in turn, is affixed to a liquid cooled rotating, tilting stage. Once the noble gas collimated ion beam incremental milling of the first surface area of the MOSFET is complete, this liquid cooled rotating tilting stage permits the formation of a thin conductive coating of carbon 122 on the planar milled first surface. Once this first surface is ion milled, the TEM grid attached to the sample is flipped over and the second surface is similarly exposed to the noble gas collimated ion beam for incremental milling to remove gallium contamination and silicon amorphization surface damage caused by the FIB. During this second-side milling step, the sample is similarly affixed with high temperature silicon or equivalent grease (for heat transfer characteristics) to the carbon planchet fixture 120, which in turn, is affixed to a liquid cooled rotating tilting stage. This thin coating of carbon preferably has a thickness ranging from about 75 angstroms to about 150 angstroms, more preferably, the thin carbon coating is less than about 100 angstroms thick. This conductive coating on the surfaces of the MOSFET is essential for subsequent holographic imaging of the defective regions of the MOSFET device.

During this process of ion milling the first surface of the MOSFET device in an incremental approach, high resolution low voltage scanning electron microscopy imaging monitors the rate of removal of material, the texture of active area(s) of the junction implant(s) as well as pinpoints the exact location of defective regions, and structures therein, of the MOSFET device. The final detection of any junction defects is accomplished by TEM holography to image junction defects and effective junction size/dimensions in comparison to a desired junction implant.

In the present invention, once the milling, coating and imaging processes of the first surface of the MOSFET device is complete, and the desired junction implant achieved, the second surface of such MOSFET device is then subjected to the above steps to provide the second surface with a milled surface coated with a thin conductive coating of carbon for use in the TEM holographic imaging step for final detection of any junction defects.

The resultant structure is shown in the top plan and cross sectional views of FIG. 6 and in the perspective view of FIG. 7. In more detail, FIGS. 6 and 7 show the MOSFET of FIG. 5B for TEM microscopy after low energy noble gas (i.e. Argon) collimated ion milling to attain the final planar surface and thickness, preferably ranging from about 200 nm to about 350 nm, required for holographic imaging. As shown, any gallium ion contamination and amorphized silicon damaged layers have been removed via this collimated, low energy noble gas ion beam milling process.

Referring to FIG. 8, the process flow of the invention permits high-resolution, e.g., about 1 nm to about 2 nm, off-axis electron holographic imaging in transmission electron microscope (TEM) to detect blocked implants, asymmetric doping, and/or channel length variations that affect the overall MOSFET device performance. This may be accomplished using the off axis electron holographic imaging incident beam as depicted in FIG. 8. The narrow image plane and technical requirements for the junction area of the MOSFET in need of repair, preferably sub-, micron 130 nm node MOSFET devices, are within 100 nm of sample edge.

Accordingly, the present invention provides a unique method for verifying site-specific defects in sub-micron MOSFET devices using TEM holography, particularly for use in modern, faster semiconductor technologies. The present method of sample preparation prior to electrical isolation of a site-specific MOSFET junction advantageously prevents damage to or rupturing of thin gate films, such as, gate oxide films less than 2 nm thick, gate nitride films less than 2 nm thick, or high dielectric constant such as k>10. The method also provides a planar, uniform final sample thickness of about 200 nm to about 350 nm, including a conductive surface film (i.e. carbon or other low atomic number element) necessary for successful holographic imaging.

Further, the invention provides a method for localization and analyzing site-specific defects in sub micron MOSFET devices that overcomes the problems associated with conventional FIB techniques including, for example, amorphous silicon damage layers, FIB induced gallium contamination, xenon difluoride, bromine contamination or effects of residual tungsten carbonyl/platinum metal deposition that results in masking the desired region of interest for subsequent holographic imaging.

That is, as smaller, faster semiconductor technologies continue to be fabricated using low-k dielectric films, particularly between copper or aluminum-copper metallization films, these low-k dielectric films are especially susceptible to induced electrical leakage effects using conventional, prior art sample preparation techniques involving FIB (focused ion beam) microscopy. The present invention advantageously avoids introduction of electrical leakage effects associated with FIB gallium ions, FIB XeF2, Bromine, and other FIB ionic charge species that would compromise the subsequent electrical isolation method required to pinpoint the defective source/drain implant region in the site-specific MOSFET device.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
What is claimed:

1. A method for electrically isolating and analyzing site-specific defects in a MOSFET comprising:
   electrically localizing at least one specific site of at least one defective feature of a MOSFET device;
   depositing a first cap layer over an exposed metal layer of said MOSFET device to cover said at least one defective feature;
   forming at least one opening in said first cap layer over said at least one specific site of said at least one defective feature;
   providing said at least one opening with at least one electrical connection;
   depositing a second cap layer over a portion of said first cap layer, said second cap layer covering said at least one defective feature and a portion of said electrical connection;
   removing said first and second cap layers at least within said at least one specific site of said at least one defective feature to obtain a site-specific junction for imaging;
   forming a conductive coating over said site-specific junction; and
   analyzing said at least one defective feature within said site-specific junction via imaging.

2. The method of claim 1 wherein the step of providing said MOSFET device with said at least one electrical connection further comprises:
   depositing a conductive liner on sidewalls of said at least one opening;
   depositing a conductive pad over said first cap layer;
   providing a plurality of conductive wiring connections between said conductive liner and said conductive pad; and
   depositing said second cap layer over said first cap layer, wherein said second cap layer fills empty portions of said plurality of openings and covers both said at least one defective feature and portions of said conductive wiring connections while leaving said conductive pad region exposed.

3. The method of claim 1 further including, prior to the step of removing said first and second cap layers, the step of sequentially polishing a first surface and a second surface of said MOSFET device to within 20 microns of said site-specific junction for imaging.

4. The method of claim 1 wherein said first and second cap layers are removed by FIB gallium ion milling.

5. The method of claim 4 further including, subsequent to said step of FIB gallium ion milling said first and second cap layers, incrementally milling, in sequence, each of a first surface and a second surface of said MOSFET device to remove implanted gallium ions during said FIB gallium ion milling, as well as remove any damaged layers of said MOSFET device.

6. The method of claim 1 wherein said MOSFET device comprises a sub-micron MOSFET device having source drain junctions less than about 80 nm deep with junction lengths less than about 100 nm.

7. The method of claim 1 wherein said MOSFET device further includes a substrate layer comprising a material selected from the group consisting of bulk silicon, silicon on insulator, strained silicon junctions and combinations thereof.

8. The method of claim 1 wherein said metal layer comprises a material selected from the group consisting of tungsten, tungsten carbonyl, platinum, nickel, alloys thereof and combinations thereof.

9. The method of claim 1 wherein said conductive coating comprises a conductive carbon coating deposited to a thickness ranging from about 75 angstroms to about 150 angstroms.

10. The method of claim 1 wherein said at least one defective feature within said site-specific junction is analyzed via holographic imaging.

11. The method of claim 10 wherein said at least one defective feature is selected from the group consisting of blocked implants, asymmetric doping, channel length variations and combinations thereof.

12. A method for electrically isolating and analyzing site-specific defects in a MOSFET comprising:
   electrically localizing at least one specific site of at least one defective feature of a MOSFET device;
   exposing a metal layer of said MOSFET device residing; over said at least one defective feature;
   depositing a high-k cap layer over said exposed metal layer to cover said at least one defective feature;
   forming at least one opening in said high-k cap layer over said at least one specific site of said at least one defective feature, said at least one opening stopping at a top surface of a metallization layer in contact with said defective feature of said MOSFET device;
   coating sidewalls of said at least one opening with a conductive liner;
   providing at least one electrical interconnection within said at least one opening in a direction leading away from the underlying MOSFET device;
   depositing a metal cap layer over a portion of said high-k cap layer to fill empty portions of said at least one opening so as to contact said metallization layer within said opening, said metal cap layer covering said at least one defective feature and a portion of said electrical interconnection;
   collimated ion milling said high-k and metal cap layers at least within said at least one specific site of said at least one defective feature using a low energy noble gas to obtain a site-specific junction for holographic imaging;
   forming a conductive coating over said site-specific junction; and
   analyzing said defective feature within said site-specific junction via high resolution electron holographic imaging.

13. The method of claim 12 wherein the step of exposing said metal layer of said MOSFET device comprises removing at least one layer over said MOSFET device in a noble gas atmosphere using an ion beam having an energy of less than about 600 electron volts and at an angle ranging from about 12 degrees to about 20 degrees, therein avoiding damage to a low-k dielectric layer of said MOSFET device.

14. The method of claim 12 wherein said high-k cap layer is deposited to a thickness ranging from about 600 angstroms to about 1500 angstroms.

15. The method of claim 12 wherein said high-k cap layer comprises a material selected from the group consisting of tetraorthosilicate, diethyl silane, titanium isoproproxide, RF deposited oxide, RF deposited nitride and combinations thereof.

16. The method of claim 12 wherein said conductive liner comprises a material selected from the group consisting of tungsten, tungsten carbonyl, platinum, nickel, alloys thereof and combinations thereof, deposited to a thickness ranging from about 50 angstroms to about 300 angstroms.

17. The method of claim 12 wherein the step of providing said at least one electrical interconnection within said at least one opening in the direction leading away from the underlying MOSFET device comprises depositing a conductive probe pad region on said high-k cap layer at a distance ranging from about 10 microns to about 20 microns away from said at least one defective feature, and said electrical interconnection is provided between said conductive liner within said opening and said conductive probe pad region.

18. The method of claim 12 further including, before the step of forming said conductive coating over said site-specific junction, incrementally milling, in sequence, each of a first surface and a second surface of said MOSFET device to remove any implanted milling ions and remove any damaged layers of said MOSFET device, as well as provide said site-specific junction with a thickness ranging from about 200 nm to about 350 nm for said holographic imaging step.

19. The method of claim 12 wherein said MOSFET device is affixed to a carbon planchet on a cooled rotating stage of an ion beam milling tool to obtain planar surface areas of said MOSFET device during said processing steps as well as form said conductive coating over said site-specific junction comprising a conductive carbon coating.

20. A method for electrically isolating and analyzing site-specific defects in a MOSFET comprising:

electrically localizing a specific site of a defective feature of a MOSFET device;

depositing a high-k cap layer over an exposed metal layer of said MOSFET device to cover said defective feature;

forming an opening in said high-k cap layer over said specific site of said defective feature;

depositing a conductive liner on sidewalls of said opening;

depositing a conductive pad region over a portion of said high-k cap layer;

providing at least one conductive wiring connection between said conductive liner and said conductive pad;

depositing a metal cap layer over said high-k cap layer, said metal cap layer filling empty portions of said opening and covering both said defective feature and portions of said conductive wiring connection while leaving said conductive pad region exposed;

sequentially polishing a first surface and a second surface of said MOSFET device to within 20 microns of said specific site of said defective feature trimming said high-k and metal cap layers within said polished regions of said MOSFET device via FIB ion milling to obtain a site-specific junction for holographic imaging;

incrementally milling, in sequence, each of said first and second surfaces to remove any implanted milling ions as well as remove any damaged layers of said MOSFET device, said incremental milling step providing said site-specific junction with a thickness ranging from about 200 nm to about 350 nm; forming a conductive coating over said site-specific junction; and analyzing said defective feature within said site-specific junction via high resolution electron holographic imaging in a transmission electron microscope.

* * * * *